United States Patent
Desireddi et al.

(10) Patent No.: US 9,703,629 B2
(45) Date of Patent: Jul. 11, 2017

(54) APPROACH TO CORRECT ECC ERRORS USING DUPLICATE COPIES OF DATA

(71) Applicant: SanDisk Technologies Inc., Plano, TX (US)

(72) Inventors: Sateesh Desireddi, Andhra Pradesh (IN); Nagi Reddy Chodem, Bangalore (IN); Sachin Krishne Gowda, Hassan (IN)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/657,677

(22) Filed: Mar. 13, 2015

(65) Prior Publication Data
US 2016/0162357 A1    Jun. 9, 2016

(30) Foreign Application Priority Data
Oct. 29, 2014  (IN) ............................ 5387/CHE/2014

(51) Int. Cl.
| | |
|---|---|
| H03M 13/00 | (2006.01) |
| G06F 11/10 | (2006.01) |
| G11C 29/52 | (2006.01) |
| G06F 3/06 | (2006.01) |
| G11C 29/42 | (2006.01) |
| G11C 29/04 | (2006.01) |

(52) U.S. Cl.
CPC .......... *G06F 11/1068* (2013.01); *G06F 3/064* (2013.01); *G06F 3/0619* (2013.01); *G06F 3/0679* (2013.01); *G06F 11/1048* (2013.01); *G11C 29/42* (2013.01); *G11C 29/52* (2013.01); *G11C 2029/0411* (2013.01)

(58) Field of Classification Search
CPC .... G06F 11/1068; G06F 3/0619; G06F 3/064; G06F 3/0629; G11C 29/52
See application file for complete search history.

(56) References Cited

U.S. PATENT DOCUMENTS

| | | | | |
|---|---|---|---|---|
| 2009/0055680 | A1* | 2/2009 | Honda ................ | G06F 11/1068 714/5.1 |
| 2011/0047440 | A1* | 2/2011 | Blackmon ........... | G06F 11/1008 714/764 |
| 2013/0024735 | A1* | 1/2013 | Chung ................ | G06F 11/1048 714/704 |

* cited by examiner

*Primary Examiner* — Sam Rizk
(74) *Attorney, Agent, or Firm* — Brinks Gilson & Lione (57) ABSTRACT

Devices and methods implemented therein in are disclosed for correcting errors in data. The method comprises determining that a first copy of data and a second copy of data include errors uncorrectable by an error correction code (ECC) engine. The ECC engine is modified based on determining that the first copy of data and the second copy of data include errors uncorrectable by the ECC engine and using the modified ECC engine, the first copy of data and the second copy of data are processed to correct the errors in the first and second copy of the data.

20 Claims, 6 Drawing Sheets

APPROACH TO CORRECT ECC ERRORS USING DUPLICATE COPIES OF DATA

PRIORITY

This application claims priority to Indian Patent Application No. 5387/CHE/2014, entitled "AN APPROACH TO CORRECT ECC ERRORS USING DUPLICATE COPIES OF DATA," filed on Oct. 29, 2014, the entire disclosure of which is hereby incorporated by reference.

TECHNICAL FIELD

This application relates generally to memory devices. More specifically, this application relates to enhancing the error correcting capability of a soft-decoding error correcting code (ECC) engine.

BACKGROUND

Non-volatile memory systems, such as flash memory, have been widely adopted for use in consumer products. Flash memory may be found in different forms, for example in the form of a portable memory card that can be carried between host devices or as a solid state disk (SSD) embedded in a host device. Flash memory may be written in pages and erased in blocks, so once a page is written, a rewrite may require the whole block to be erased. Rewrites may be necessary if there is a write error or failure. For example, NAND defects including broken word lines (WL) or word line to word line (WL-WL) shorts may result in data errors. Protection may be necessary to limit write failures and allow for data recovery in the case of a failure.

SUMMARY

According to one aspect, a method for correcting errors is disclosed. Based on determining that a first copy of data and a second copy of data include errors uncorrectable by an error correction code (ECC) engine, the ECC engine is modified. The first copy of data and the second copy of data are processed using the modified ECC engine to correct the errors in the first and second copy of the data.

According to another aspect, a set of data is read from a first memory page. In response to determining that a number of bits in error in the set of data exceed a data correction threshold for an error correction code (ECC) engine, a copy of the set of data is read from a second memory page. In response to determining that a number of bits in error in the copy of the set of data exceed the data correction threshold for the ECC engine, the ECC engine is modified using the set of data and the copy of the set of data. The set of data and the copy of the set of data are then processed with the modified ECC engine.

According to yet another aspect a device comprising a first and second memory page, a logic unit, an error correction code (ECC) engine modification unit and an enhanced post write read (EPWR) unit is disclosed. The first and second memory page each store a copy of a set of data. The logic unit is configured to perform logic operations on data stored in the first and second memory page. The ECC engine modification unit is configured to modify parameters of an ECC engine. The EPWR unit is configured to, determine that a number of bits in error in the data read from the first memory page and the secondary page exceeds a threshold of the ECC engine, cause the logic unit to compare data read from the first memory page with data read from the second memory page, and cause the ECC engine modification unit to configure the ECC engine based on a result of the comparison.

DETAILED DESCRIPTION

Methods for improving the error correcting capabilities of an error correction code (ECC) engine are described herein. Generally, an ECC engine receives a set of binary data. The set of binary data includes an ECC that may have been previously computed by the ECC engine. The ECC engine utilizes the previously computed ECC to correct bits in error in a set of binary data.

For a given implementation, an ECC engine is capable of correcting only a threshold number of bits in error in the set of binary data. This threshold may be expressed as a percentage of bits in error in the set of binary data. When the number of bits in error exceeds this threshold number, the ECC engine is incapable of correcting any of the bits in error. When the number of bits in error in a set of binary data exceeds the threshold number, the errors in the set of binary data are considered uncorrectable and may be referred to as uncorrectable ECC (UECC) errors.

Methods described herein improve the error correcting capability for a given implementation of an ECC engine. Improvements include increasing the threshold number of bits in error in a set of binary data that may be corrected by a given ECC engine.

Figure 1:
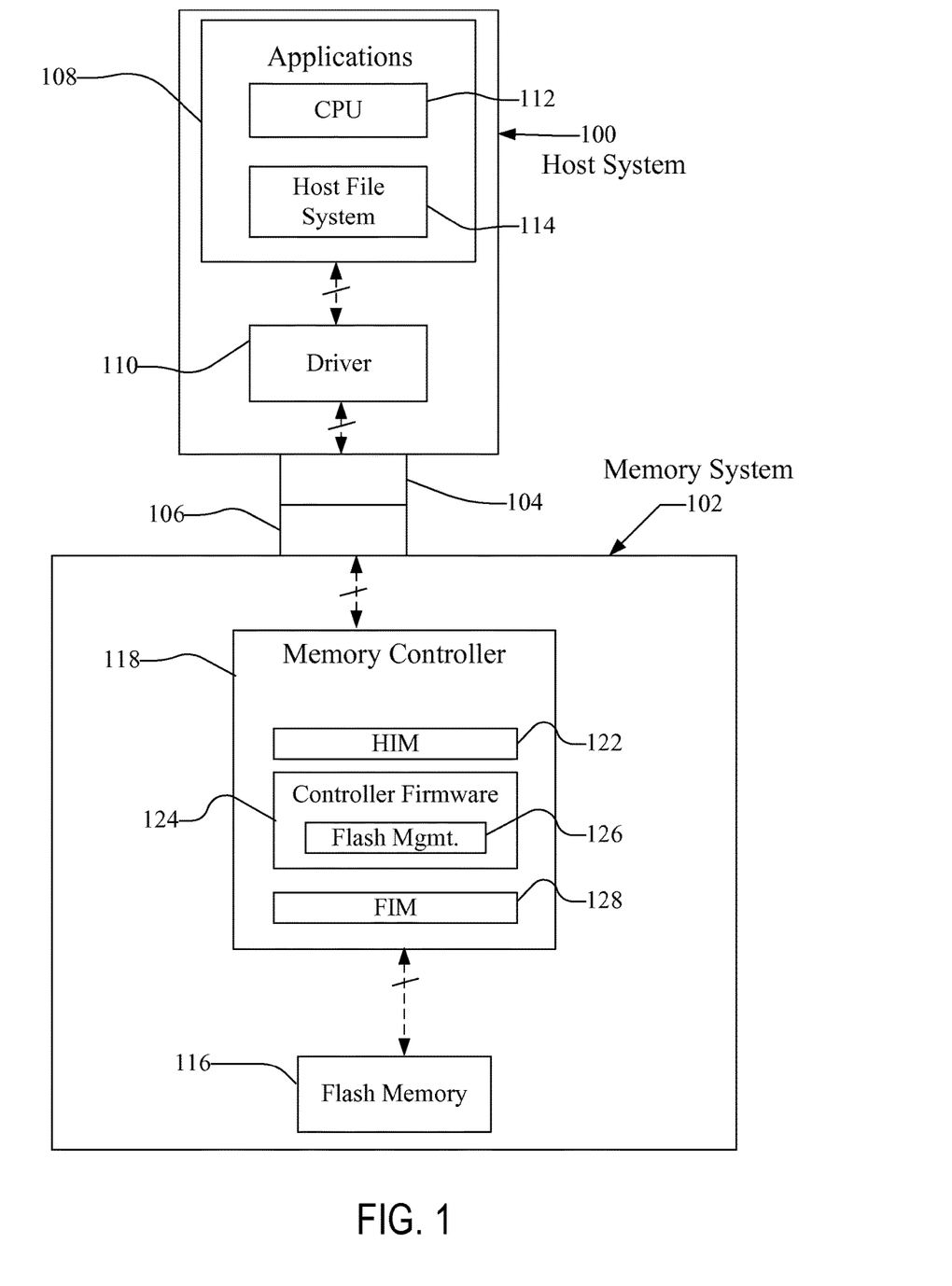
FIG. 1 is a block diagram of a host connected with a memory system having non-volatile memory.

A system that includes an ECC engine and implements methods that improves upon the number of bits in error that the ECC engine can correct is shown in FIG. 1. A host system 100 of FIG. 1 stores data into and retrieves data from a memory system 102. The memory system 102 may be embedded within the host, such as in the form of a solid state disk (SSD) drive installed in a personal computer. Alternatively, the memory system 102 may be in the form of a flash memory card that is removably connected to the host through mating parts 104 and 106 of a mechanical and electrical connector as illustrated in FIG. 1. A memory system 102 configured for use as an internal or embedded SSD drive may look similar to the schematic of FIG. 1, with one difference being the location of the memory system 102 internal to the host. SSD drives may be in the form of discrete modules that are drop-in replacements for rotating magnetic disk drives. As described, flash memory may refer to the use of a negated AND (NAND) cell that stores an electronic charge.

Examples of commercially available removable flash memory cards include the CompactFlash (CF), the MultiMediaCard (MMC), Secure Digital (SD), miniSD, Memory Stick, SmartMedia, TransFlash, and microSD cards. Although each of these cards may have a unique mechanical and/or electrical interface according to its standardized specifications, the flash memory system included in each may be similar. These cards are all available from SanDisk Corporation, assignee of the present application. SanDisk also provides a line of flash drives under its Cruzer trademark, which are hand held memory systems in small packages that have a Universal Serial Bus (USB) plug for connecting with a host by plugging into the host's USB receptacle. Each of these memory cards and flash drives includes controllers that interface with the host and control operation of the flash memory within them.

Host systems that may use SSDs, memory cards and flash drives are many and varied. They include personal computers (PCs), such as desktop or laptop and other portable computers, tablet computers, cellular telephones, smartphones, personal digital assistants (PDAs), digital still cameras, digital movie cameras, and portable media players. For portable memory card applications, a host may include a built-in receptacle for one or more types of memory cards or flash drives, or a host may require adapters into which a memory card is plugged. The memory system may include its own memory controller and drivers but there may also be some memory-only systems that are instead controlled by software executed by the host to which the memory is connected. In some memory systems containing the controller, especially those embedded within a host, the memory, controller and drivers are often formed on a single integrated circuit chip. The host may communicate with the memory card using any communication protocol such as but not limited to Secure Digital (SD) protocol, Memory Stick (MS) protocol and Universal Serial Bus (USB) protocol.

The host system 100 of FIG. 1 may be viewed as having two major parts, insofar as the memory system 102 is concerned, made up of a combination of circuitry and software. An applications portion 108 may interface with the memory system 102 through a file system module 114 and driver 110. In a PC, for example, the applications portion 108 may include a processor 112 for running word processing, graphics, control or other popular application software. In a camera, cellular telephone that is primarily dedicated to performing a single set of functions, the applications portion 108 may be implemented in hardware for running the software that operates the camera to take and store pictures, the cellular telephone to make and receive calls, and the like.

The memory system 102 of FIG. 1 may include non-volatile memory, such as flash memory 116, and a memory controller 118 that both interfaces with the host 100 to which the memory system 102 is connected for passing data back and forth and controls the memory 116. The memory controller 118 may be implemented on a single integrated circuit chip, such as an application specific integrated circuit (ASIC). The memory controller 118 may include a multi-thread processor capable of communicating via a memory interface 128 having I/O ports for each memory bank in the flash memory 116. The memory controller 118 may include an internal clock. The processor of the memory controller 118 may communicate with an error correction code (ECC) module, a RAM buffer, and a boot code ROM via an internal data bus.

The memory controller 118 may convert between logical addresses of data used by the host 100 and physical addresses of the flash memory 116 during data programming and reading. Functionally, the memory controller 118 may include a Host interface module (HIM) 122 that interfaces with the host system controller logic 110, and controller firmware module 124 for coordinating with the host interface module 122, and flash interface module (FIM) 128. Flash management logic 126 may be part of the controller firmware 124 for internal memory management operations such as garbage collection. One or more flash interface modules (FIMs) 128 may provide a communication interface between the controller and the flash memory 116. The memory device firmware may handle memory in logical groups and the logical to physical address table (i.e. the global address table or "GAT") may have an entry for each logical group. In particular, the GAT page may include mapping of the logical to the physical address translation for each logical group.

A flash transformation layer ("FTL") or media management layer ("MML") may be integrated in the flash management 126 and may handle flash errors and interfacing with the host. In particular, flash management 126 is part of controller firmware 124 and FTL may be a module in flash management. The FTL may be responsible for the internals of NAND management. In particular, the FTL may be an algorithm in the memory device firmware which translates writes from the host 100 into writes to the flash memory 116. The FTL may include the logical block address ("LBA") map that translates addresses for the flash memory. An FTL algorithm may provide logical to physical address mapping which includes an algorithm to convert logical addresses from the file system to physical addresses of flash memory. The FTL may include the establishment or classification of meta-blocks and the dual programming of those meta-blocks as discussed below with respect to FIGS. 5-12.

In one embodiment, the flash memory 116 may be considered to include multi-level cell (MLC) or single level cell (SLC) memory. The memory may be included as part of the memory controller 118 rather than as part of the flash memory 116 in some embodiments. The flash memory 116 may be mostly MLC, while binary cache and update blocks may be SLC memory. Update blocks may be SLC memory with page based addressing or page based Logical Group (LG) organization. The LG size for the GAT may depend on the data. For example, sequential data may be indexed with a large LG size, while fragmented data may be indexed with a smaller LG size. In particular, the GAT may default to a large LG size, but reference additional GAT pages for fragmented data, where the additional GAT pages include a smaller LG size. The LG size for the GAT and additional GAT pages may occur at the FTL or flash management 126 of the controller 118.

Figure 2:
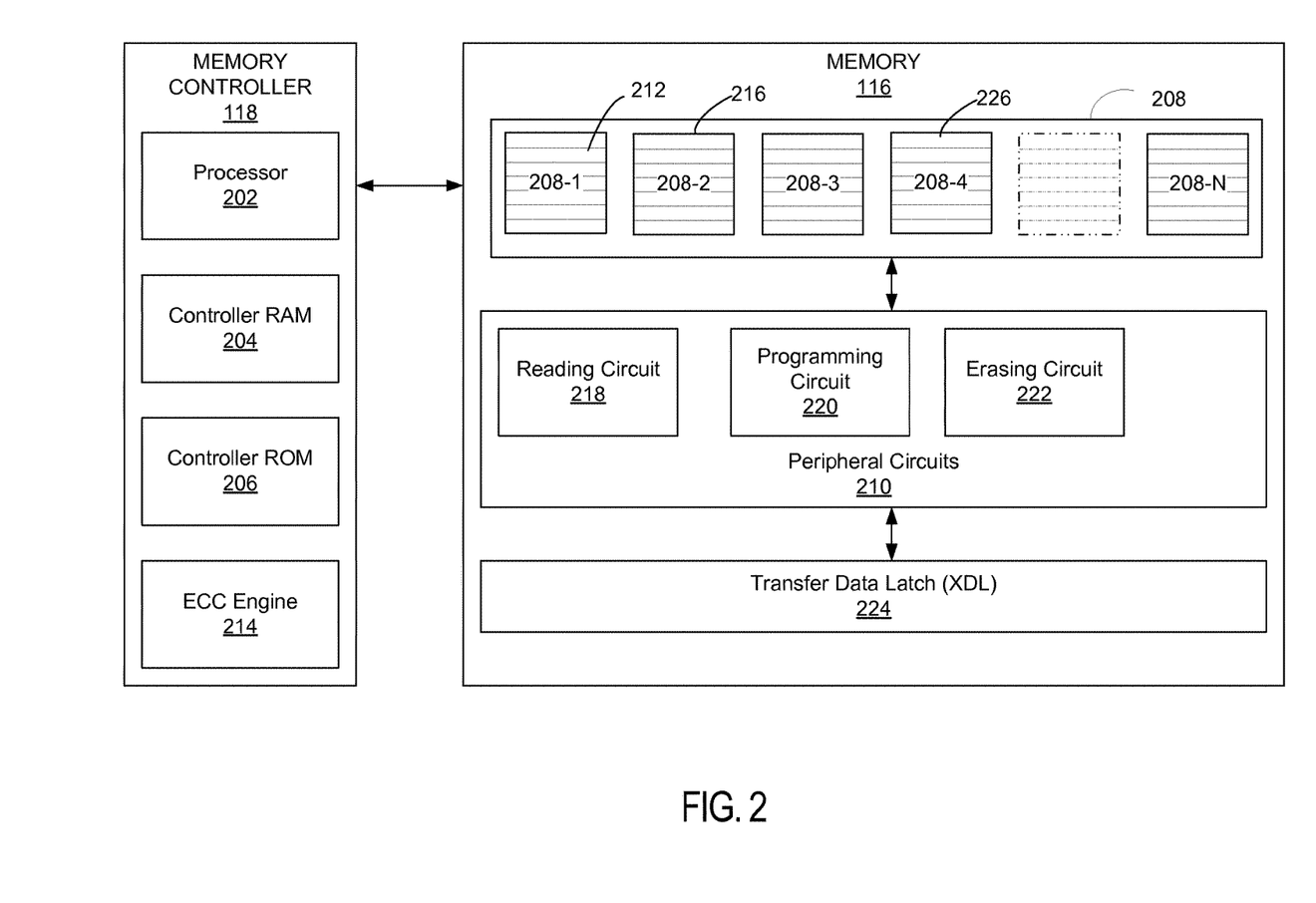
FIG. 2 is a block diagram of an alternative memory communication system.

FIG. 2 is a block diagram of an exemplary memory system 200. In an embodiment, memory system 200 may correspond to the memory system 102 of FIG. 1. In this embodiment, the memory system 200 comprises a memory controller 118 and memory 116.

By way of example and without limitation, in an embodiment, memory controller 118 includes a processor 202, controller RAM 204, controller ROM 206 and error correcting code (ECC) engine 214. The processor 202 may comprise a microprocessor, a microcontroller, an application specific integrated circuit (ASIC), a field programmable gate array, a logical digital circuit, or other now known or later developed logical processing capability.

Controller ROM 206 may store software instructions that processor 202 may execute to control the operation of memory system 200. In a preferred embodiment, controller ROM 206 may also store software instructions corresponding to functionality associated with enhancing the error correcting capability of the soft-decoding ECC engine 214. In an embodiment, controller ROM 206 may also include instructions that when executed by processor 202 perform the functionality logically ascribed to HIM 122, controller firmware 124 and FIM 128.

ECC engine 214 is configured to receive binary data and compute an ECC for the received binary data, in one mode of operation. ECC engine 214 may also receive the size of the set of binary data. In another mode of operation, ECC engine 214 is configured to receive binary data that includes a previously computed ECC. In this mode of operation, ECC engine 214 may utilize the previously computed ECC to verify the integrity of the received binary data. In response to determining that the received data includes bits that are in error, ECC engine 214 may utilize the previously computed ECC to recover or correct the bits in error. As previously explained, ECC engine 214 is capable of only correcting errors in the binary data if the number of bits in error in the binary data is less than a threshold number. In an embodiment, in response to receiving an indication from the ECC engine 214 that the errors in the binary data are uncorrectable because the number of errors exceeds a threshold number typically correctable, controller 202 may provide information regarding the location of the bits in error in the binary data to the ECC engine 214. Using this information, ECC engine 214 may correct more of the previously uncorrectable errors. An example of a suitable soft decision decoding-based ECC engine 214 one that implements the low-density parity-check code (LDPC).

Separately, ECC engine 214 may compute the ECC for data in a memory page whenever the data in the memory page is read out by memory controller 118. The memory controller 118 may read out the data from the memory page in response to receiving a request from host 100. The ECC engine 214 may compare the computed ECC with the ECC that was stored in the memory page when the data was written to the memory page. Generally, if the number of bits in error or the bit error rate (BER) of the data of a memory page is below a threshold, the ECC engine 214 may utilize the ECC stored with the data to recover the bits in error. If the number of bits in error exceeds the threshold, the errors are uncorrectable. In an embodiment, ECC engine 214 may be reconfigured to increase threshold number of bit in error that can be corrected. Reconfiguring the ECC engine 214 to increase the threshold number of bit in error that can be corrected constitutes modifying or altering the ECC engine 214.

Soft decision decoding-based ECC engines such as an ECC engine that implements the LDPC use probabilistic methods to identify and correct bits in error in a set of binary data. Typically, a soft decision decoding-based ECC engine assumes that the probability that a particular bit of data in the set of data is in error is same as the probability that another bit of data in the set of data is in error, if there is no or insufficient information to alter the probabilities. The probability may be referred to as error probability. The maximum number of bits in error that the soft decision decoding-based ECC engine can successfully correct is related to the error probabilities assigned to the respective data bits in the data set. The error probability corresponds to a modifiable parameter of a soft decision decoding-based ECC engine, in an embodiment. Typically, a soft decision decoding based ECC engine is initialized with default error probabilities for the data bits. Typically, all the bits are assigned the same default error probabilities.

In an embodiment, the default error probabilities for the ECC engine are modified during operation to change the error probabilities assigned to certain bits of data in the set of data. Changing the error probabilities may increase the threshold number of bits in error that the modified ECC engine may correct. Thus, this modification of error probabilities allows the ECC engine to correct errors when the number of bits in error exceeds the threshold number. Methods described herein may determine the probable locations of the bits in error and instruct the ECC engine to assign a different error probability to the bits at the determined locations. By utilizing the updated error probabilities for the bits in a set of binary data, the ECC engine may correct a larger percentage of bits in error. In an embodiment, based on the number of bits in error, the error probabilities assigned to bits corresponding to the location of the bits in error may be increased. by a factor of up to 50%. Correspondingly, the threshold number of bits in error that a soft decision decoding-based ECC may correct may be increased when reconfigured with higher error probabilities assigned to certain bits of data determined to be in error. In another embodiment, the error probabilities assigned to bits corresponding to the location of the bits that are not in error may be decreased. In yet another embodiment, the error probabilities assigned to bits corresponding to the location of the bits in error may be increased and the error probabilities assigned to bits corresponding to the location of the bits that are not in error may be decreased.

In an exemplary embodiment, memory 108 includes non-volatile memory 208, peripheral circuits 210 and a transfer data latch 224. In a preferred embodiment, non-volatile memory 208 comprises NAND flash memory. In this embodiment, non-volatile memory 208 is organized as N memory blocks 208-1 to 208-N. A memory block is organized as a set of memory pages or simply pages, memory page 212 for example. A page is a smallest unit of writing in the memory 208 and a memory block is the smallest unit of erasing. Thus, data is typically programmed or stored on a page by page basis. However, erasing data programmed in a page requires erasure of all the pages in the memory block. Data received from the host system 100 is typically programmed or stored in an erased memory page.

Each page consists of a set of single-level cell (SLC) or multi-level cell (MLC). A SLC memory can store a single bit of data per cell. MLC memory can store multiple bits of data per cell. For example, two-level MLC memory can store 2 bits of data per cell, three level MLC memory can store 3 bits of data per cell and N level MLC memory can store N bits of data per cell. Typical sizes of memory pages are 16 Kilobytes (Kbytes). A memory block, 208-1 for example, typically consists of hundreds of memory pages. In describing exemplary embodiments herein, the term "cell" is used to refer to both SLC and MLC. A memory cell can be in an erased state or a programmed state. A memory page with memory cells in an erased state may be referred to as an erased memory page.

Both types of cells (SLC and MLC) store data by storing electric charge (charge). The amount of electric charge stored in a cell is representative of the data bit(s) stored in the cell. For example, in case of an erased SLC, no charge or an infinitesimal amount of electric charge is stored in the SLC and this uncharged state represents a bit value of 0. In contrast, a predefined amount of electric charge stored in an SLC, represents the bit value of 1. In the case of an N-level MLC, $2^N$ different predefined amounts of charge may be stored to represent anyone of the N values. For example, a three-level MLC is configured to store any one of eight amounts of electric charge values ($2^3=8$). The number of different amounts of electric charge that may be stored in a memory cell may be referred to as the density of the memory cell. Thus a 3-level MLC is denser than a 2-level MLC and so on. Methods for storing data in memory page described herein, may determine the amount of electric charge stored in the erased memory cells of a memory page and based on the amount of electric charge measured, may store data in the memory page at a reduced density. Componentry of the peripheral circuits 210 read the amount of charge stored in a cell and translate the amount to a binary value.

In an embodiment, peripheral circuit 210 includes programming circuit 220, reading circuit 218, erasing circuit 222 and transfer data latch (XDL) 224. The XDL 224 functions as intermediate data storage between memory controller 118 and memory 108. When instructed by host system 100 to write data to memory 108, memory controller 118 writes data to XDL 224. The programming circuit 220 then writes the data from XDL 224 to the specified memory block and page. In an embodiment, the programming circuit 220 translates the binary representation of data received from host system 100 into programming voltages and periods. The programming circuit applies these programming voltages for the programming periods to memory cells to cause the memory cells to store electric charge. The amount of stored electric charge is representative of the binary representation of the received data.

Similarly, when instructed to read data from a specified memory page, reading circuit 218 reads data from the specified memory page into the XDL 224 and memory controller 118 transfers the read data from the XDL 224 to controller RAM 204. In an embodiment, the reading circuit 218 of FIG. 2 translates the amount of charge stored in a memory cell to a binary representation of the data corresponding to the amount of charge stored in the cell. By way of example and without limitation, the reading circuit 218 may include current to voltage convertors, amplifiers and analog to digital convertors.

Generally writing data to an SLC memory block takes less time than writing the same amount of data to an MLC memory block. However, an MLC memory block has a higher density than an SLC memory block. To take advantage of the speed of SLC and the higher density of MLC, memory 108 may comprise both SLC memory blocks and MLC memory blocks, as is the case of the memory 108 illustrated in FIG. 2. For example, memory blocks 208-1 to 208-2 may be SLC memory blocks comprised of SLC memory pages. Memory pages 208-4 to 208-N may be MLC memory blocks comprised of MLC memory pages. Where memory 108 comprises both SLC memory blocks and MLC memory blocks, it may be desirable first to store data into an SLC memory page of an SLC memory block, 212 for example, and subsequently move the data to a MLC memory page, 226 for example. Moving data from SLC memory blocks to MLC memory blocks may be performed by processor 202 either as a background operation or when memory system 200 is idle (e.g., not being accessed by host system 100). The process of moving valid data from SLC memory blocks to one or more MLC memory blocks may be referred to as folding. Examples of folding are discussed in U.S. Patent Application Publication No. 2001/0153911 A1. After data is transferred from the SLC memory pages, the SLC memory block may be erased and prepared to accept new data. Folding may also be performed on memory blocks. For example, valid data from three SLC memory blocks may be folded into a single 3-level MLC memory block. The memory pages of the SLC memory blocks may likewise be erased after the folding operation. Data folded to an MLC memory block is checked for ECC errors and then committed, where committing the data includes updating the reference to the current MLC location of the folded data in the mapping table for the non-volatile memory. Typically, a fold operation is performed when all the memory pages in an SLC memory block are written to and each contains either valid data or obsolete data.

In an embodiment, the memory controller 118 maintains a copy of the logical to physical address table in controller RAM 204. An entry in the table includes a reference to a memory page. Thus, the logical to physical address table may comprise an array of references to memory pages. One format of an entry in the table may comprise a reference to the memory block associated with the memory page and an index of the memory page in the memory block. As an example, a reference to memory page 212 may comprise a reference to memory block 208-1 and the index of memory page 212 in memory block 208-1.

The host system 100 when requesting a write of data to a memory page specifies a logical block address (LBA). In response to receiving a request from host system 100 to write data to a logical address, processor 202 may identify an erased memory page. In an exemplary embodiment, processor 202 may identify an erased memory page in an SLC memory block, memory page 212 for example. Processor 202 may instruct ECC engine 214 to compute an ECC for the data. Processor 202 may write the data and the ECC to XDL 224 and may instruct the programming circuits 220 to store the data and the computed ECC in the identified SLC memory page.

Processor 202 may utilize the LBA received with the request to write data as an index to an entry in the logical to physical address table corresponding to LBA. If the entry includes a reference to a memory page, processor 202 may mark the memory page as containing obsolete data. Processor 202 may update the entry with a reference to the SLC memory page to which data was stored.

As previously discussed, data stored into an SLC memory block may be folded to an MLC memory block. In an embodiment, memory controller 118 may implement an enhanced post-write-read error management (EPWR) scheme as part of the folding operation. In an EPWR scheme, during a fold operation, previously stored valid data and its corresponding ECC may be read from an SLC memory page. As previously discussed, when data is stored in an SLC memory page, an ECC for the data may also be stored with the data. The ECC engine 214 may be instructed to check the read data for bits in error. If the ECC engine 214 indicates that there are no errors, the read data and the ECC may be stored to an erased MLC page. If the read data includes correctable errors, i.e. the number of bits in errors is below the threshold number for the ECC engine, the ECC engine 214 may utilize the ECC to correct any bits in error in the read data. The corrected data and its ECC may be stored to an MLC page. The SLC page may then be reclaimed or erased.

In another embodiment, in response to receiving a request to store data, processor 202 may write the data and the computed ECC in a first erased SLC memory page, 212 for example, and a second erased SLC memory page, 216 for example. The first erased SLC memory page may be referred to as the primary memory page and the second erased SLC memory page may be referred to as the secondary memory page. Storing a copy of the data and the ECC into each of a primary and a secondary memory page may be referred to as dual programming.

Using the above described EPWR scheme, during a fold operation, the data stored in the primary memory page may be validated by the ECC engine 214. If no errors are detected by ECC engine 214, processor 202 may commit the data stored to the primary memory page to an MLC memory page. Separately, if all the errors in the data stored in the primary memory page can be corrected by the ECC engine i.e. no uncorrectable errors, the corrected data may be folded and/or committed to a MLC memory page. The primary and secondary SLC memory page may be reclaimed when the SLC memory blocks to which they belong are erased.

However, if the errors in the data stored in the primary memory page are uncorrectable because the number of bits in error exceeds the computational capabilities of the ECC engine 214, the integrity of the data stored in the secondary memory page may be verified by the ECC engine 214. If no errors are detected by ECC engine 214, processor 202 may copy the data stored in the secondary memory page to an erased MLC memory page. Separately, if all the errors in the data stored in the secondary memory page can be corrected by the ECC engine 214 i.e. no uncorrectable errors, the corrected data may be committed or folded to an erased MLC memory page. The primary and secondary SLC memory page may be reclaimed when the SLC memory blocks to which they belong are erased.

In an embodiment, in response to determining the data stored in both the primary and secondary memory page contain uncorrectable errors, the data stored in the primary memory page may be compared with the data stored in the secondary memory page to ascertain the locations of the bits in error. In an exemplary embodiment, a bit-wise exclusively OR-ed (XORed) may be performed between the data stored in the secondary memory page and the data stored in the primary memory page. Bits that are correct, i.e. not in error, in both the primary memory page and the secondary memory page will be set to 0 after the XOR operation. Bits that are in error in either the primary or secondary memory page will be set to 1 after the XOR operation.

In one exemplary embodiment, the locations of the non-zero bits may be provided to the ECC engine 214. The ECC engine 214 may utilize the location information of the non-zero bits and the data stored in the primary memory page and the secondary memory page to correct the uncorrectable errors. In an embodiment, ECC engine 214 may increase the error probability assigned to the non-zero bits. Increasing the error probability assigned to the non-zero bits allows the ECC engine 214 to correct errors when the number of bits in error exceeds the threshold number for the ECC engine 214. In an embodiment, the default error probability assigned to all of the bits may be set to 0.5. After identifying the location of the non-zero bits, the error probabilities assigned to the non-zero bits may be increased to 0.6 for example and the error probabilities assigned to the zero bits may be decreased to 0. In another embodiment, memory controller 118 may configure the error probabilities for the ECC engine 214 based on the location of the non-zero bits of data. In an embodiment after correction of the bits in error, the corrected data may be folded to an erased memory page. The primary and secondary SLC memory page may be reclaimed when the corrected version of the data has been committed to the new MLC location so that the primary and secondary SLC memory blocks from which the data was folded may be erased.

Figure 3A:
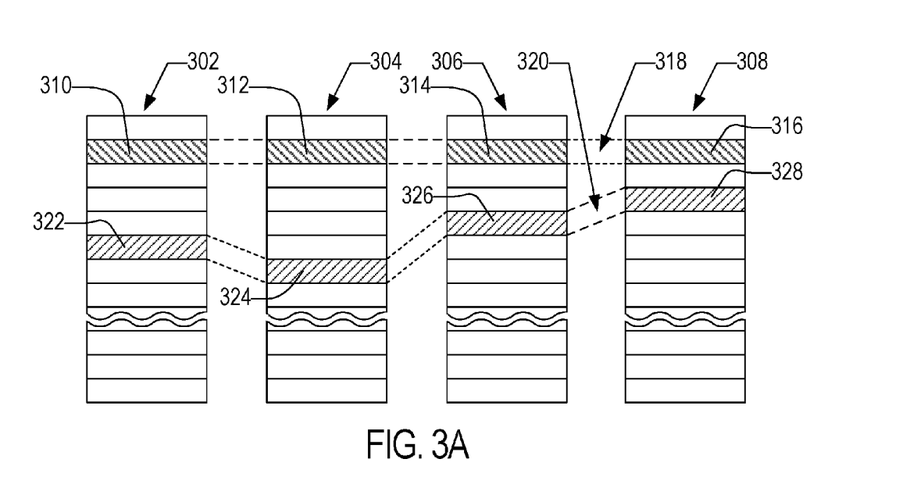
FIG. 3A illustrates an example physical memory organization of the system of FIG. 1.
Figure 3B:
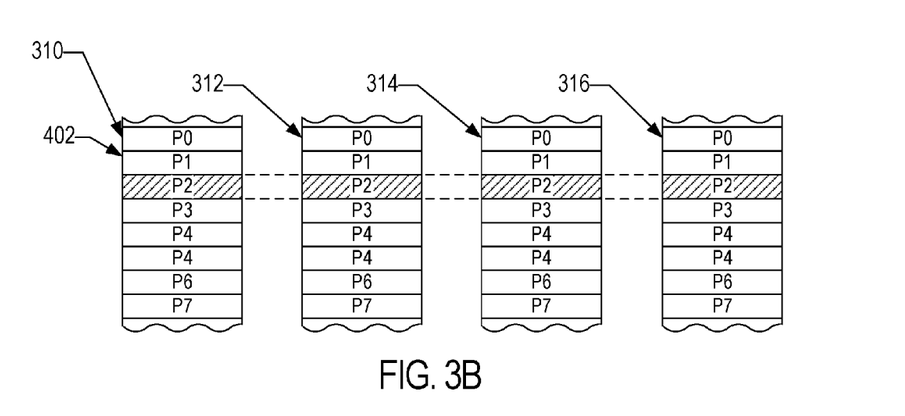
FIG. 3B illustrates another example physical memory organization of the system of FIG. 1.

FIG. 3 conceptually illustrates an organization of the flash memory 116 (FIG. 1) as a cell array. The flash memory 116 may include multiple memory cell arrays which are each separately controlled by a single or multiple memory controllers 118. Four planes or sub-arrays 302, 304, 306, and 308 of memory cells may be on a single integrated memory cell chip, on two chips (two of the planes on each chip) or on four separate chips. Although not shown in FIG. 3, the meta-blocks described below with respect to FIG. 6 may be linked from across different dies. For example, there may be two planes per di and the meta-block linking shown in FIG. 6 links planes from different dies.

Other numbers of planes, such as 1, 2, 8, 16 or more may exist in a system. The planes may be individually divided into groups of memory cells that form the minimum unit of erase, hereinafter referred to as blocks. Blocks of memory cells are shown in FIG. 3 by rectangles, such as blocks 310, 312, 314, and 316, located in respective planes 302, 304, 306, and 308. There can be any number of blocks in each plane. The block of memory cells is the unit of erase, and the smallest number of memory cells that are physically erasable together. For increased parallelism, however, the blocks may be operated in larger metablock units or pages. One block from each plane is logically linked together to form a metablock. The four blocks 310, 312, 314, and 316 are shown to form one metablock 318. All of the cells within a metablock are typically erased together. The blocks used to form a metablock need not be restricted to the same relative locations within their respective planes, as is shown in a second metablock 320 made up of blocks 322, 324, 326, and 328. Although it is usually preferable to extend the metablocks across all of the planes, for high system performance, the memory system can be operated with the ability to dynamically form metablocks of any or all of one, two or three blocks in different planes. This allows the size of the metablock to be more closely matched with the amount of data available for storage in one programming operation. As described below with respect to FIG. 6, the meta-block may be created with planes from different dies. In other words, each meta-block includes planes from different dies.

Figure 4:
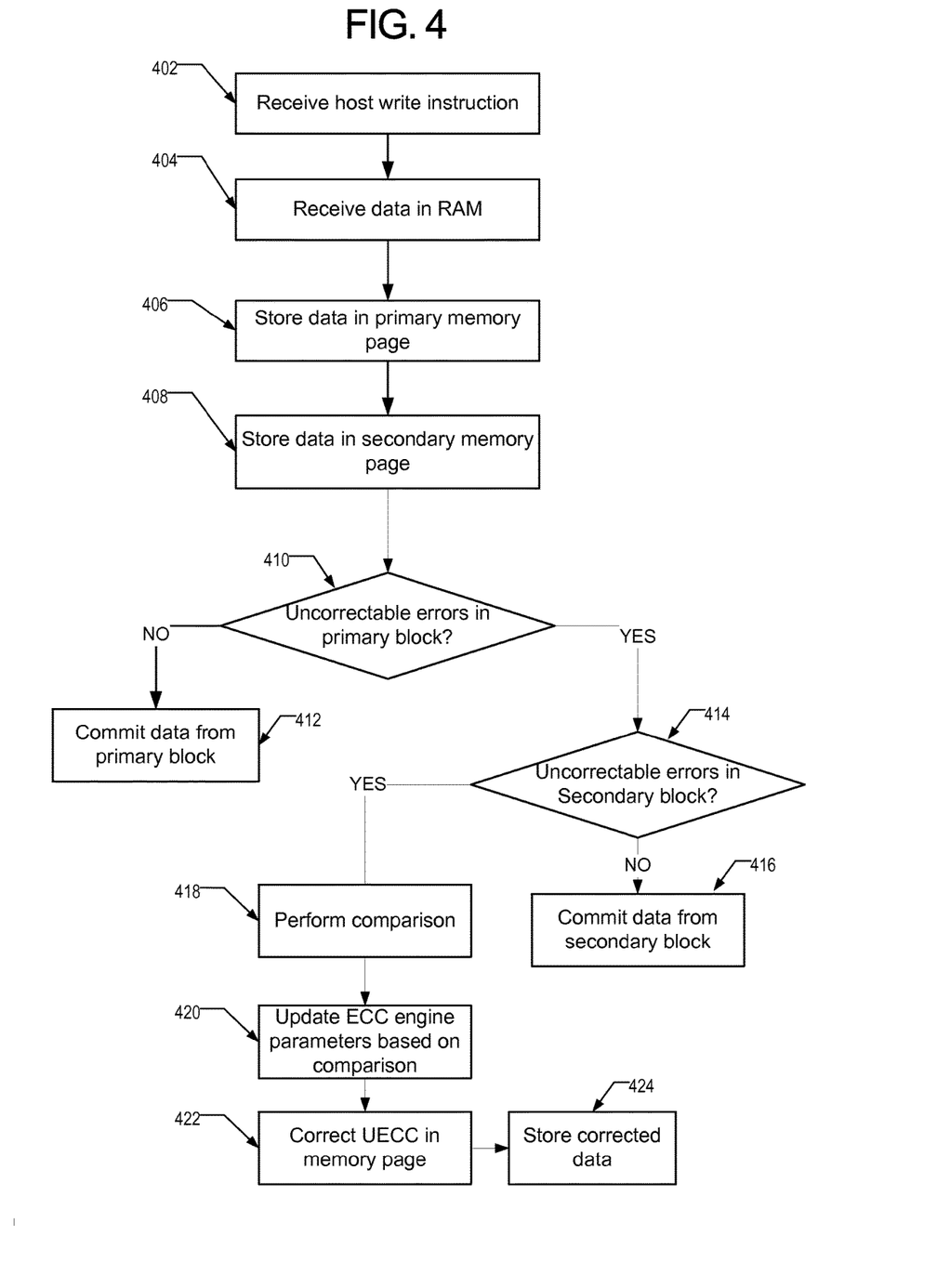
FIG. 4 is a flow diagram of an example method for improving the error correcting capabilities of a soft decision decoding ECC engine.

The individual blocks may be divided for operational purposes into pages of memory cells, as illustrated in FIG. 4. The memory cells of each of the blocks 310, 312, 314, and 316, for example, are each divided into eight pages P0-P7. Alternatively, there may be 16, 32 or more pages of memory cells within each block. The page is the unit of data programming and reading within a block, containing the minimum amount of data that are programmed or read at one time. However, in order to increase the memory system operational parallelism, such pages within two or more blocks may be logically linked into metapages. A metapage 402 is illustrated in FIG. 3, being formed of one physical page from each of the four blocks 310, 312, 314, and 316. The metapage 402, for example, includes the page P2 in each of the four blocks but the pages of a metapage need not necessarily have the same relative position within each of the blocks. A metapage may be the maximum unit of programming.

FIG. 4 is flow chart illustrating improvement to a soft decision decoding-based ECC engine by using an exemplary dual programming process. At step 402, a host write instruction is received at the memory system (e.g. at the host interface). Based on the instruction from the host (to program certain data on the memory), the data is received in controller RAM 204 at step 404.

Dual programming may be performed at steps 406 and 408. Dual programming may include simultaneous or near simultaneous programming of the same data in a primary and secondary memory pages. At step 406, an erased memory page may be identified in memory 208. This memory page may correspond to the primary memory page.

At step 406, ECC engine 214 may be instructed to compute an ECC for the data received at step 404. The data received at step 404 and the computed ECC may be stored in the primary memory page.

At step 408, another erased memory page may be identified in memory 208. This memory page may correspond to the secondary memory page. At step 408, ECC engine 214 may be instructed to compute an ECC for the data received at step 404. The data received at step 404 and the computed ECC may be stored in the secondary memory page, at step 408.

At step 410, the previously described EPWR scheme may be implemented for the primary memory page. For example, the data and previously computed ECC written to the primary memory page at step 406 may be read back into RAM, controller RAM 204 for example. At step 410, the ECC engine 214 may be instructed to verify the integrity of the read data. The ECC engine 214 may utilize the previously computed ECC to determine the number of bits in error in the data. If the number of bits in error is below a threshold number, the ECC engine 214 may correct the bits in error. The corrected data may be stored in another erased memory page. Alternatively, the ECC engine 214 may transmit an indication that the data has no UECC. If the data has no UECC, the data may be left in the primary memory page. If however, the number of bits in error exceeds the error-correcting capabilities of the ECC engine, an indication that the data has uncorrectable errors may be received at step 410.

If at step 410 an indication is received that the data read from memory page has no UECC, program flow may branch to step 412 and the data and ECC stored in primary memory page may be committed. In another embodiment, ECC engine 214 may correct the errors and compute a new ECC. The corrected data and ECC may be written and committed to another erased page, in another embodiment. If however, an indication is received from ECC engine 214 that the primary memory page has UECC, program flow may branch to step 414.

At step 414, the previously described EPWR scheme may be implemented for the secondary memory page. For example, the data and previously computed ECC written to the secondary memory page at step 408 may be read back into RAM, controller RAM 204 for example. At step 414, the ECC engine 214 may be instructed to verify the integrity of the read data. The ECC engine 214 may utilize the previously computed ECC to determine the number of bits in error in the data. If the number of bits in error is below a threshold number, the ECC engine 214 may correct the bits in error. Alternatively, the ECC engine 214 may transmit an indication that the data has no UECC. If the data has no UECC, the data stored in the secondary memory page may be committed. If however, the number of bits in error exceeds the error-correcting capabilities of the ECC engine, an indication that the data has uncorrectable errors may be received at step 414.

If at step 414 an indication is received that the data read from secondary memory page has no UECC, program flow may branch to step 416 and the data and ECC stored in secondary memory page may be committed. If however, an indication is received from ECC engine 214 that the number of bits in error in the secondary memory page exceeds the threshold number for the ECC engine 214, program flow may branch to step 418.

At step 418, memory controller may compare the data read from the primary and secondary memory pages. In an embodiment, the comparison may comprise performing a bitwise logical XOR operation between the data read from the primary memory page and the secondary memory page. As previously explained, a bit that is incorrect in one memory page and correct in the other memory page will be set in the result of the bitwise XOR operation.

At step 420, memory controller 118 may identify the location of the set bits in the result. The ECC engine may be instructed to increase the error probabilities associated with the location of set bits and decrease the error probabilities associated with the location of the zero bits. In an embodiment, the error probabilities provided to the ECC engine may be based on the result of the bitwise logical XOR operation. In this embodiment, the ECC engine 214 may be instructed to use increased error probabilities for the bits corresponding to the location of the set bits in the result. For example, bits in error may be assigned an error probability of 0.6 instead of 0.5. At step 422, memory controller 118 may instruct the ECC engine 214 to correct bits in error in the data read from the primary and secondary page using the reconfigured error probabilities. At step 424 corrected data may be received from ECC engine 214 and stored in an erased memory page.

In an embodiment, methods steps 410 to 424 may be performed as part of a folding operation. In this embodiment, primary and secondary memory pages may correspond to SLC memory pages 212 and 216 respectively, for example. In this embodiment, the integrity of the data stored in primary SLC memory page may be verified by ECC engine 214, for example, at step 410. If the data from the memory page has no ECC errors, the data may be folded to an MLC memory page, 226 for example, at step 412. Alternatively, if the data has correctable errors, the corrected data may be folded to an MLC memory page at step 412. If however, the number of errors in the data read from the primary SLC memory page exceeds the threshold number of the ECC engine making them uncorrectable, the process may be repeated with the data read from the secondary SLC memory page at step 414.

At step 414, if the data read from the secondary SLC memory page has no ECC errors, the data may be folded to an MLC memory page, 226 for example, at step 416. Alternatively, if the data has correctable errors, the corrected data may be folded to an MLC memory page at step 416.

If however the number of errors in the data read from the secondary SLC memory page also exceed the threshold number of the ECC engine making the errors uncorrectable, at step 418 a comparison may be performed between the data read from primary and secondary SLC memory pages. At step 420, the ECC engine may be modified based on the result of the comparison. For example, the error probability for the bits that are different in the data read from the primary memory page and secondary page may be adjusted. As previously discussed, the ECC engine may be modified by adjusting the error probability for select bits such that the threshold number of bits that the modified ECC engine can now correct is increased. At step 422, the modified ECC engine may be instructed to operate on the data read from the primary and secondary memory pages. The modified ECC engine may correct the errors in the data read from the primary and secondary memory pages. At step 424, the corrected data may be folded to an MLC memory page.

Although the foregoing method is described in the context of primary and secondary pages, the method is extensible to operate on multiple primary and secondary memory pages simultaneously.

Figure 5:
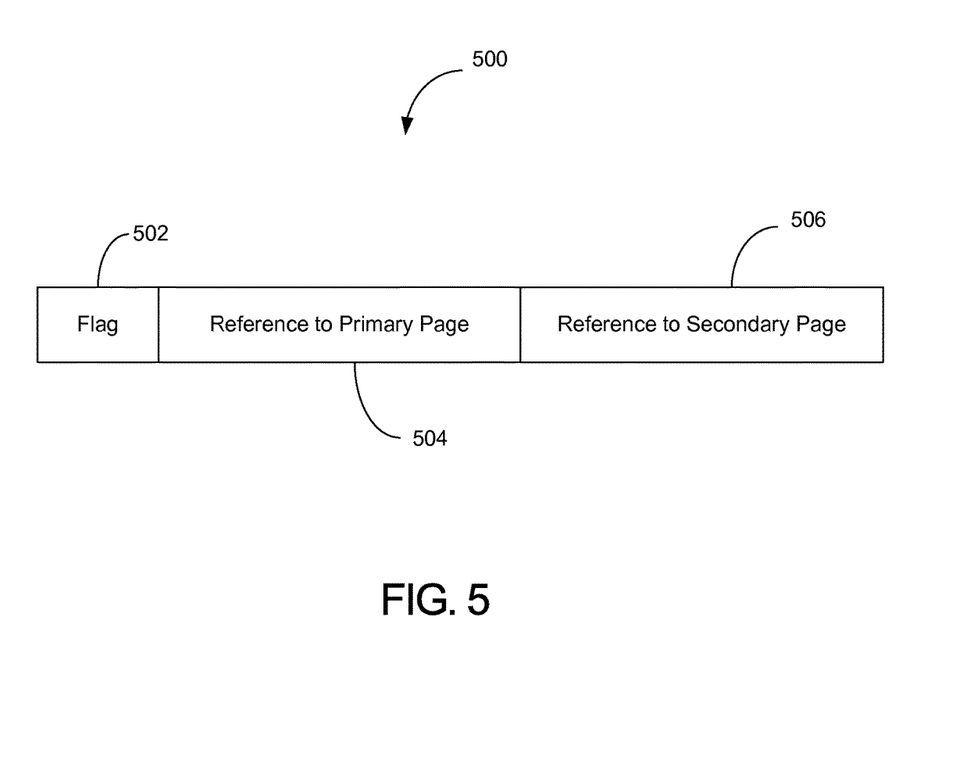
FIG. 5 is a data structure that may be utilized to correct errors in 2 dimensional or 3 dimensional (2D/3D) memory systems.

FIG. 5 is exemplary data structure 500 that may be maintained when implementing the above described improvement to a soft decision decoding-based ECC engine 214, for example, when using dual programming. The data structure 500 may be stored in controller RAM 204. Data structure 500 comprises several data fields. By way of example and without limitation, data structure 500 comprises flag 502, reference to a primary memory page 504 or primary reference 504, for simplicity, and reference to a secondary memory page 506 or secondary reference 506, for simplicity.

In an exemplary embodiment, in response to receiving a request to store data in memory 116, memory controller 118 or specifically processor 202 may execute software instructions to cause the instantiation of the data structure 500 in controller RAM 204. In the previously discussed dual programming scheme, memory controller 118 may identify an erased primary and secondary memory page. A reference to the primary memory page may be stored in primary reference 504 and a reference to the secondary memory page may be stored in secondary reference 506. The flag 502 may be set to indicate that the primary reference 504 and secondary reference 506 contain valid references to memory pages. Memory controller 118 may store the received data in the erased primary and secondary memory pages. In an embodiment, the primary and secondary memory pages may be a SLC memory pages. At a later time, memory controller 118 may perform the previously described EPWR scheme, for example when performing a fold to an MLC page. After data is committed or folded to an MLC page, the flag 502 may be cleared. Another process may detect the cleared flag and reclaim the primary or secondary memory page.

Figure 6:
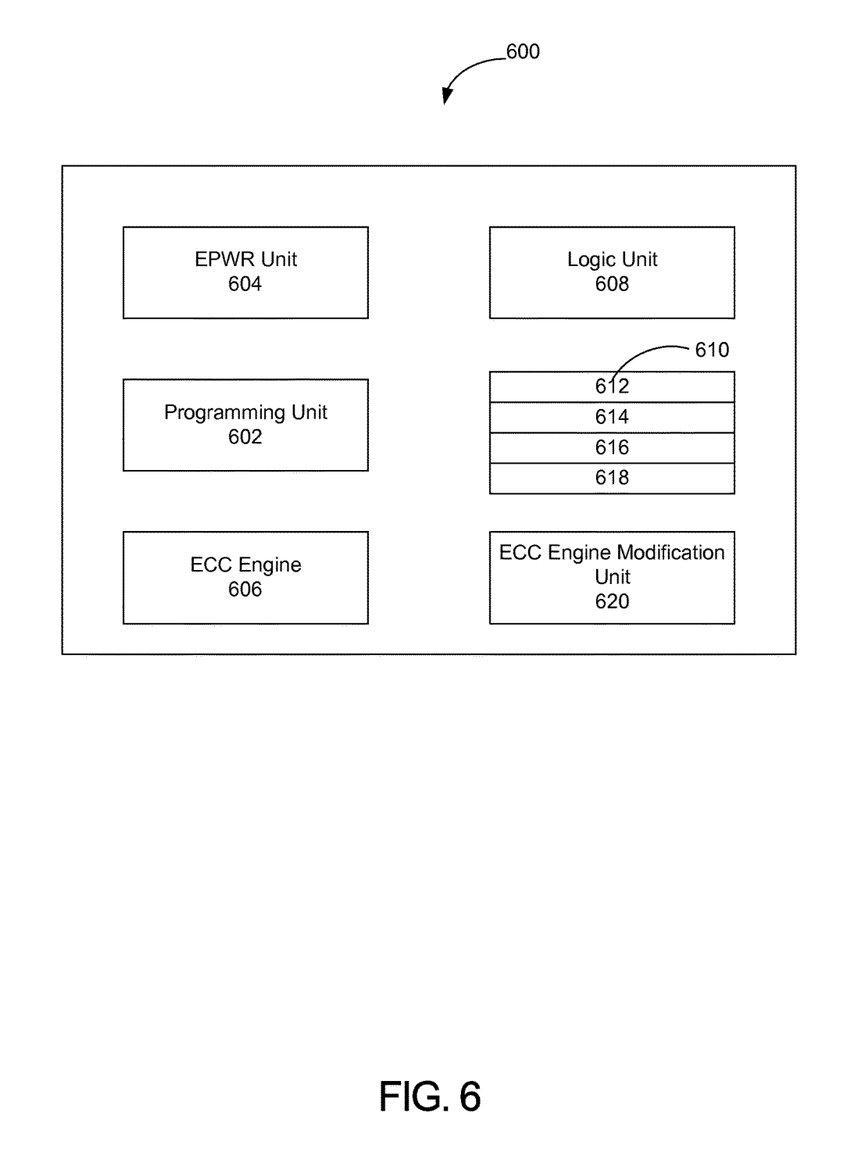
FIG. 6 is block diagram of an example device that corrects errors in 2D/3D memory systems.

FIG. 6 is a block diagram of an exemplary device 600 that may correct for uncorrectable errors in a set of data using methods described herein. By way of example and without limitation, device 600 comprises programming unit 602, an EPWR unit 604, an ECC unit 606, logic unit 608, ECC engine modification unit 620, and memory 610 with memory pages 612-618.

ECC engine 606, in one mode, is configured to compute an ECC for a received set of data. In another mode, ECC engine 606 is configured to correct bits in error in a set of data using a previously computed ECC. ECC engine 606 is also configured to indicate if the number of bits in error in a received set of data is greater than a threshold and therefore uncorrectable. In an embodiment, ECC engine 606 may be configured to correct uncorrectable errors by changing the error probabilities that may be used for correcting one or more bits of data in a set of data.

In an embodiment, programming unit 602 is configured to perform dual programming. In this embodiment, in response to receiving a request from a host to a store data in memory 610, programming unit 602 identifies an erased primary and secondary memory page, 612 and 614 for example. Programming unit 602 stores the received data in the primary and secondary memory page. In an embodiment, before storing the data in the primary and secondary memory pages, programming unit 602 may cause ECC engine 606 to generate an ECC for the received data. The generated ECC may be stored with the data in the primary and secondary memory pages.

Logic unit 608 is configured to perform logic operations. For example, logic unit 608 may be instructed to perform a bit wise XOR on a first copy and a second copy of a data set.

In an embodiment, EPWR unit 604 is configured to read the stored data in the primary and secondary memory pages and cause the ECC engine 606 to verify the integrity of the read data. In response to receiving an indication from the ECC engine 606 that both the primary and secondary memory pages contain uncorrectable errors, in an exemplary embodiment, EPWR unit 604 may be configured to cause the logic unit 608 to perform a bitwise XOR operation between data from the primary and secondary memory pages. The result of the bitwise XOR operation may be communicated to the ECC engine modification unit 620.

ECC engine modification unit 620 may be configured to analyze the result of the bitwise XOR operation and identify the location of the bits in the result that are set. ECC engine modification unit 620 may configure ECC engine 606 with updated error probabilities for the bits that are set. ECC engine modification unit 620 may then cause ECC engine 606 to correct the uncorrectable errors using the data and ECC read from the primary and secondary memory pages. Programming unit 602 may store the corrected data in another erased memory page.

The device 600 may be implemented in many different ways. Each unit, such as the programming unit 602, an EPWR unit 604, an ECC unit 606, logic unit 608, and ECC engine modification unit 620 may be hardware or a combination of hardware and software. For example, each unit may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each unit may include memory hardware, such as a portion of the controller ROM 206 (FIG. 2), for example, that comprises instructions executable with the processor 202 or other processor to implement one or more of the features of the circuit. When any one of the unit includes the portion of the memory that comprises instructions executable with the processor, the unit may or may not include the processor 202. In some examples, each unit may just be the portion of the controller ROM 206 or other physical memory that comprises instructions executable with the processor 202 or other processor to implement the features of the corresponding unit without the unit including any other hardware. Because each circuit includes at least some hardware even when the included hardware comprises software, each circuit may be interchangeably referred to as hardware circuit, such as the programming unit 602, an EPWR unit 604, an ECC unit 606, logic unit 608, and ECC engine modification unit 620.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magneto-resistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

A "computer-readable medium," "machine readable medium," "propagated-signal" medium, and/or "signal-bearing medium" may comprise any device that includes, stores, communicates, propagates, or transports software for use by or in connection with an instruction executable system, apparatus, or device. The machine-readable medium may selectively be, but not limited to, an electronic, magnetic, optical, electromagnetic, infrared, or semiconductor system, apparatus, device, or propagation medium. A non-exhaustive list of examples of a machine-readable medium would include: an electrical connection "electronic" having one or more wires, a portable magnetic or optical disk, a volatile memory such as a Random Access Memory "RAM", a Read-Only Memory "ROM", an Erasable Programmable Read-Only Memory (EPROM or Flash memory), or an optical fiber. A machine-readable medium may also include a tangible medium upon which software is printed, as the software may be electronically stored as an image or in another format (e.g., through an optical scan), then compiled, and/or interpreted or otherwise processed. The processed medium may then be stored in a computer and/or machine memory.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

We claim:

1. A method comprising:
   receiving a write command with a set of data that is temporarily stored at a first memory page, wherein a copy of the set of data is temporarily stored at a second memory page;
   reading, from the first memory page, the set of data;
   in response to determining that a number of bits in error in the set of data exceed a threshold for an error correction code (ECC) engine, reading, from the second memory page, the copy of the set of data;
   in response to determining that a number of bits in error in the copy of the set of data exceed the threshold for the ECC engine, comparing the set of data with the copy of the set of data;
   modifying the ECC engine based on the comparison;
   processing the set of data and the copy of the set of data using the modified ECC engine to correct errors; and
   storing the data permanently, based on the comparison after the errors are corrected.

2. The method of claim 1 wherein determining that the number of bits in error in the set of data exceeds the threshold is based on processing the set of data with the ECC engine.

3. The method of claim 1 wherein determining that the number of bits in error in the copy of the set of data exceeds the threshold is based on processing the copy of the set of data with the ECC engine.

4. The method of claim 1 wherein using the data and the copy of the data to modify the ECC engine comprises performing an exclusive or (XOR) operation between the data and the copy of the data.

5. The method of claim 4 further comprising locating a respective location of non-zero bits in a result of the XOR operation and modifying the ECC engine based on the respective locations.

6. The method of claim 1 further comprises storing a reference to the first memory page in a first entry of a data structure and a reference to the second memory page in a second entry of the data structure.

7. The method of claim 6 further comprises storing an indication in the data structure in response to detecting that the number of bits in error in the set of data and in the copy of the set of data exceeds the threshold.

8. A device comprising:
   a first and second memory page, each storing a copy of a set of data;
   a logic unit configured to perform logic operations on data stored in the first and second memory page;
   an error correction code (ECC) engine modification unit configured to modify parameters of an ECC engine; and
   an enhanced post write read (EPWR) unit configured to:
      determine that a number of bits in error in the data read from the first memory page and the secondary page exceeds a threshold of the ECC engine;
      cause the logic unit to compare data read from the first memory page with data read from the second memory page; and
      cause the ECC engine modification unit to configure the ECC engine based on a result of the comparison.

9. The device of claim 8 wherein the logic unit in response to being caused to compare data read from the first memory page with data read from the second memory page is configured to perform a bitwise exclusive or (XOR) operation between data read from the first memory page and data read from the second memory page.

10. The device of claim 8 wherein the ECC engine implements the low-density parity-check code (LDPC) and wherein the parameter modified by the ECC engine modification unit corresponds to an error probability of the ECC engine.

11. A storage device comprising:
   a memory comprising memory blocks for data storage;
   a controller coupled with the memory for programming the memory blocks;
   an error correction code (ECC) engine coupled with the controller configured to correct errors in data when a number of errors is below a threshold for a first copy of the data from dual programming and without reading from a second copy of the data; and
   an enhanced post write read (EPWR) unit configured to compare the first copy of the data with the second copy of the data when the number of errors is above the threshold for the second copy of the data in addition to the first copy of the data.

12. The storage device of claim 11, wherein the dual programming comprises programming of the memory blocks with a first copy and a second copy of data for error correction purposes.

13. The storage device of claim 12, wherein the first copy and the second copy are duplicate copies of data stored in update blocks.

14. The storage device of claim 13, wherein the data is committed from only one of the first copy or the second copy.

15. The storage device of claim 14, wherein the first copy comprises a primary block from the memory blocks and the second copy comprises a secondary block from the memory blocks.

16. The storage device of claim 15, wherein the data is committed from the secondary block only when the primary block includes uncorrectable ECC (UECC) errors.

17. The storage device of claim 16, wherein the UECC error includes when the number of errors is above the threshold.

18. The storage device of claim 17, wherein when the number of errors is above the threshold for both the primary block and the secondary block, the EPWR unit is configured to compare the data stored in the primary block with the data stored in the secondary block.

19. The storage device of claim 11, wherein the ECC engine is updated based on the comparison to increase error probabilities associated with a location of set bits and decrease error probabilities associated with a location of zero bits.

20. The storage device of claim 11, wherein errors from both copies of data are corrected based on the comparison.

\* \* \* \* \*